United States Patent [19]

Hirata et al.

[11] Patent Number: 5,291,374
[45] Date of Patent: Mar. 1, 1994

[54] SEMICONDUCTOR DEVICE HAVING AN OPENING AND METHOD OF MANUFACTURING THE SAME

[75] Inventors: Seiichi Hirata, Yokosuka; Akito Yoshida, Chigasaki, both of Japan

[73] Assignee: Kabushiki Kaisha Toshiba, Kawasaki, Japan

[21] Appl. No.: 920,304

[22] PCT Filed: Dec. 17, 1991

[86] PCT No.: PCT/JP91/01721
§ 371 Date: Aug. 17, 1992
§ 102(e) Date: Aug. 17, 1992

[30] Foreign Application Priority Data

Dec. 17, 1990 [JP] Japan .................. 2-402804
Dec. 20, 1990 [JP] Japan .................. 2-404483
Dec. 9, 1991 [JP] Japan .................. 3-350370

[51] Int. Cl.$^5$ .............................. H05K 7/02
[52] U.S. Cl. .................. 361/760; 361/707; 361/767; 361/810; 174/52.2; 174/255; 257/686; 257/781
[58] Field of Search ........ 361/380, 388, 396, 400–403, 361/397, 411, 417, 418, 420; 174/52.2, 52.1, 255; 257/686, 787, 783, 784

[56] References Cited

U.S. PATENT DOCUMENTS

| | | | |
|---|---|---|---|
| 4,509,096 | 4/1985 | Baldwin et al. | 361/386 |
| 5,081,562 | 1/1992 | Adachi et al. | 361/401 |
| 5,095,627 | 3/1992 | Bujagec et al. | 29/832 |

*Primary Examiner*—Leo P. Picard
*Assistant Examiner*—Young Whang
*Attorney, Agent, or Firm*—Foley & Lardner

[57] ABSTRACT

There is disclosed a semiconductor device having an insulating film formed on a substrate in which a semiconductor element is formed; an electrode pad is formed on the insulating film and is electrically connected to the semiconductor element by a signal line; an insulating protective film which covers the semiconductor substrate and has an opening for connecting an external circuit connection device to expose the surface of the electrode pad and an exposing opening, provided at peripheral portion of the electrode pad, for exposing a side of the electrode pad; and an external circuit connection device connected to the electrode pad via the opening for connecting.

Since the side of the electrode pad can be exposed by forming an exposing opening in the insulating film, in the case where the inner lead is connected to the electrode pad via bump using ILB or the case where the wire bonding is applied to the electrode pad, the force applied to the electrode pad can be released by deformation of the electrode pad.

20 Claims, 9 Drawing Sheets

SEMICONDUCTOR DEVICE HAVING AN OPENING AND METHOD OF MANUFACTURING THE SAME

TECHNICAL FIELD

This invention relates to a semiconductor device which can relieve force applied to electrode pads during the implementation of inner lead bonding (ILB) or wire bonding, and a manufacturing method therefor.

BACKGROUND OF THE INVENTION

Semiconductor devices such as LSI and IC generally have external terminals through which semiconductor elements inside the semiconductor devices are electrically connected to external circuits. As an external terminal, an outer lead of a tape carrier is sometimes utilized and a lead of a lead frame or other means is also utilized. The outer lead is connected to an inner lead of the tape carrier, and the inner lead is electrically connected to an internal circuit of a semiconductor device through an electrode pad provided to the surface of the semiconductor device. The lead of the lead frame is electrically connected to the electrode pad via a bonding wire.

The electrode pads are left exposed for a long time before finally being sealed and protected by resin. However, since materials of the electrode pads consist mainly of aluminum or aluminum alloy, their moisture-resistance characteristic is insufficient and they are therefore easily corroded. Consequently, an insulating protective film is provided on the surface of the electrode pad. Since the electrode pads have to be connected to an external circuit connecting means, the insulating protective film is partially removed on the electrode pads to expose the pads and the external circuit connecting means is then connected. The insulating protective film is removed by a so-called excessive removal method in which an insulating protective film of larger area than that of the electrode pad is removed, has usually been used because of the ease of the process. However, by this method, the function of protection will almost be lost because the electrode pad is excessively exposed. Therefore, a so-called partial removal method in which the insulating protective film is partially removed to expose the necessary area of the electrode pad has come to be used. According to this method, since the electrode pad is sufficiently protected, the characteristics of semiconductor devices are not deteriorated.

With reference to FIGS. 14 to 17, a conventional semiconductor device using the partial removal method will be described hereinbelow.

As shown in FIG. 7 which is a plan view of a semiconductor device of the present invention, a semiconductor device 1 having a bump structure is provided with a semiconductor element 10 and a plurality of electrode pads 2 arranged around the outer periphery of the semiconductor element 10, with the semiconductor element 10 and the electrode pads being connected by signal lines 5. FIG. 14 shows a cross sectional view of the electrode pad part of the conventional semiconductor device. The electrode pads 2 are connected to inner leads 15 of a tape carrier by an ILB (Inner Lead Bonding) process, for instance, so that signals can be transmitted or received or a power voltage can be supplied between the electrode pads 2 and the inner lead 15. The ILB is a bonding to connect the electrode pad and the inner lead by a bump.

Next, with reference to FIGS. 14 and 15, the structure of an electrode pad of a conventional semiconductor device will be described. FIG. 15 is a perspective plan view of the structure shown in FIG. 14, with the inner lead 15 omitted. An electrode pad 2 is formed on a semiconductor substrate 11 via an insulating film 12, and the electrode pad 2 is covered with a protective film 9. This protective film 9 is formed with an opening 6 for bump connection, and a bump 7 is formed on the electrode pad via the opening 6 for the bump connection. This bump 7 serves to connect the inner lead 15 to the electrode pad 2. A barrier metal layer 8 is formed between the electrode pad 2 and the bump 7.

Though an example in which a bump is provided on an electrode and the bump is connected to the inner lead of a tape carrier has been described, there is also a wire bonding method in which a fine wire of aluminum or gold is connected to the electrode pad. The other end of the fine wire or the bonding wire is connected to the lead frame and a terminal formed on the lead frame becomes an external terminal of the semiconductor device.

When the inner lead 15 of a tape carrier is heated and pressed by an ILB tool, the force applied to the inner lead is transmitted to the bump 7. This force applied from the inner lead 15 to the bump 7 is transmitted to the electrode pad 2 via the barrier metal layer. The force transmitted to the electrode pad 2 will be transmitted in all directions. However, the transmission of force is hindered at the side and upper surface of the electrode pad 2 resulting the force to concentrate in the downward direction. As a result, the force is transmitted to the semiconductor substrate 11 through the insulating film 12 as a base film. In this case, when the gap between the two adjacent electrode pads is narrow as shown in FIG. 16, the force applied to the electrode pad 2 increases so that a crack 4 occurs in the insulating film 12 under the electrode pad 2 or another crack 3 occurs under between the two adjacent electrode pads 2. As described, the operation of the force at the bonding is explained in the cross sectional views of FIG. 16 and 17.

In the case of the occurrence of cracks 3 or 4 in the insulating film 12, since moisture enters the cracks, the pads are corroded, thus raising a problem in that signals sometimes cannot be transmitted between the electrode pads 2 and the inner leads 15. Furthermore, electric leakage sometimes occurs between the two adjacent electrode pads due to moisture which has entered the crack. The force from the bonding wire which is connected to the lead frame is another force transmitted from the electrode pad to the substrate through an insulating film other than the force transmitted from the inner lead to the bump at ILB. The wire bonding method has the electrode pads on the semiconductor substrate connected to external circuit connection terminals by bonding wires using bonding tools such as capillaries or wedges. Since this bonding is performed by pressing metals to be connected with the application of heat and/or ultrasonic waves, there is a force which is transmitted to the insulating film.

Thus, if the partially removal method described with reference to drawings is employed as the method to expose the electrode pad from the insulating film in place of the excessive removal method, there still exists the problem of damage by the occurrence of cracks in the insulating film because of the concentration of forces applied at bonding, to the insulating film.

With these problems in mind, the object of the present invention is to provide a semiconductor device which does not generate cracks in the insulating film during ILB or wire bonding and the method of manufacturing the same semiconductor device.

SUMMARY OF THE INVENTION

The present invention features an exposing opening formed in the insulating film at the periphery of the electrode pad to externally expose the side of the electrode pad.

According to the first aspect of the present invention, there is provided a semiconductor device comprising a substrate in which a semiconductor element is formed; an insulating layer formed on said substrate; an electrode pad formed on said insulating film, said electrode pad being electrically connected to said semiconductor element by a signal line; an insulating protective film covering said semiconductor substrate, said insulating protective film being provided with an opening for connecting an external circuit connection means to expose the surface of said electrode pad and an exposing opening, provided at a peripheral portion of said electrode pad, for exposing a side of said electrode pad; and an external circuit connection means connected to the electrode pad via said opening for connecting an external circuit connection means. As the external circuit connection means, a bonding wire can be used. Further, according to the second aspect of the present invention, there is provided a semiconductor device, comprising: a substrate in which a semiconductor element is formed; an insulating layer formed on said substrate; an electrode pad formed on said insulating film, said electrode pad being electrically connected to said semiconductor element by a signal line; an insulating protective film covering said semiconductor substrate, said insulating protective film being provided with a bump connection opening for exposing surface of said electrode pad and an exposing opening, provided at peripheral portion of said electrode pad, for exposing a side of said electrode pad; and a bump formed at said electrode pad via said bump connection opening; and an inner lead which is connected to said bump. The electrode pad is composed of aluminum or its alloy and is connected to the bump and the inner lead via barrier metal. The exposing opening is formed so as to enclose peripheral portion of said electrode pad except for portion where a signal line is provided. The exposing opening is formed so as to enclose whole periphery of said electrode pad or is formed so as to enclose peripheral portion of said electrode pad in divided form. A plurality of said electrode pads are arranged side by side on said semiconductor substrate, and said exposing opening is provided at each side facing to neighboring electrode pad in the peripheral portion. A plurality of said electrode pads are arranged side by side on said semiconductor substrate, and said exposing opening is provided between the electrode pads which are arranged side by side. The length of said exposing opening is longer than that of the side of the electrode pad facing the neighboring electrode pad and the exposing opening projecting from the facing sides of the electrode pads and the exposing opening projecting from the facing sides of the electrode pads.

According to the present invention, there is provided a method of manufacturing a semiconductor device, comprising the steps of: forming an insulating film on a semiconductor substrate in which a semiconductor element is formed; forming an electrode pad on said insulating film conductive layer, said electrode pad being electrically connected to said semiconductor element by a signal line; forming an insulating protective film for covering said semiconductor substrate; forming an opening for connecting an external circuit connection means to expose the surface of said electrode pad and an exposing opening, provided at peripheral portion of said electrode pad, for exposing a side of said electrode pad by the same etching process; and connecting an external circuit connection means connected to the electrode pad via said opening for connecting an external circuit connection means.

Since the side of the electrode pad can be exposed by forming an exposing opening in the insulating film, in the case where the inner lead is connected to the electrode pad via bump using ILB or the case where the wire bonding is applied to the electrode pad, the force applied to the electrode pad can be released by deforming of the electrode pad.

BRIEF DESCRIPTION OF THE DRAWINGS

FIG. 11 is a perspective plan view of the third embodiment of the present invention;

FIG. 12 is a perspective plan view of the third embodiment of the present invention;

DESCRIPTION OF THE PREFERRED EMBODIMENTS

The embodiments of the present invention will be described hereinbelow with reference to the attached drawings. First, the first embodiment of the present invention will be described with reference to FIGS. 1 to 7.

Figure 1:
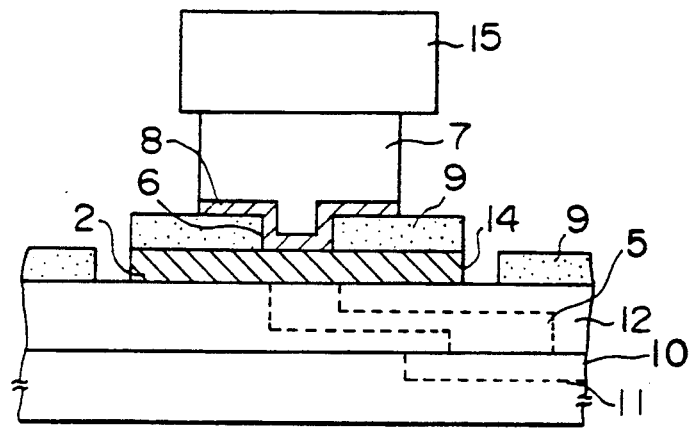
FIG. 1 is a cross sectional view of the first embodiment of the present invention.
Figure 2:
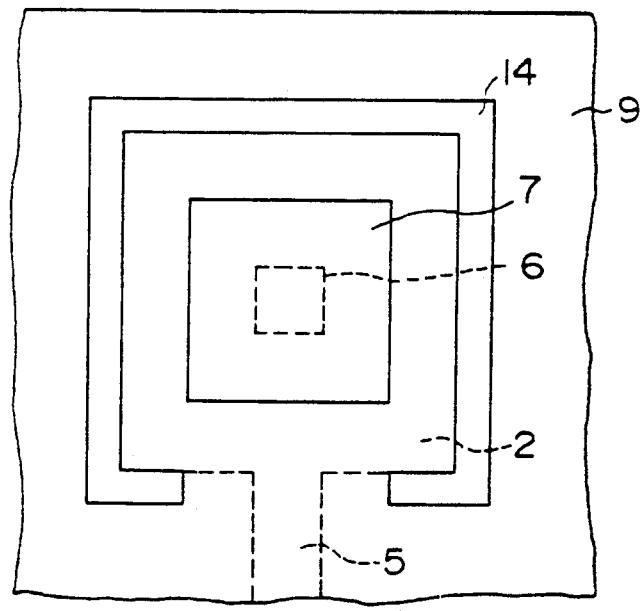
FIG. 2 is a perspective plan view of the first embodiment of the present invention.
Figure 4A:
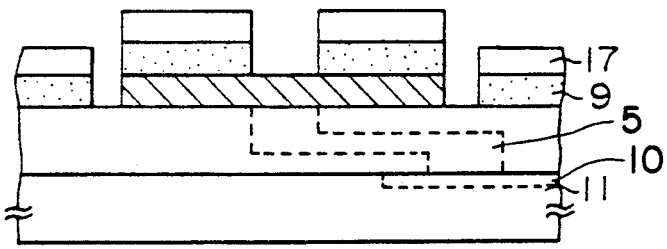
FIG. 4(a) and (b) shows the manufacturing process of the first embodiment of the present invention.
Figure 4B:
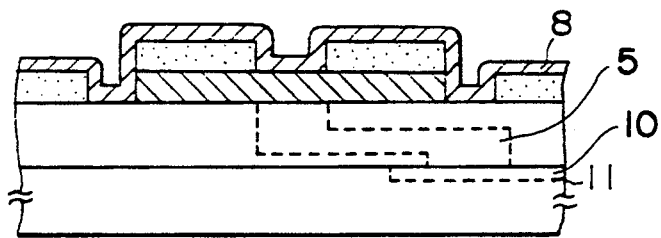
Figure 5A:
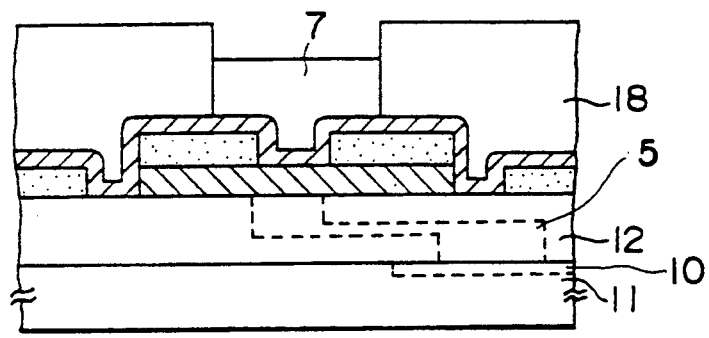
FIG. 5(a) and (b) shows the manufacturing process of the first embodiment of the present invention.
Figure 5B:
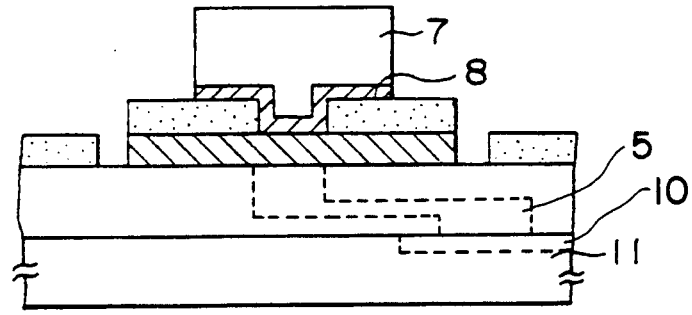
Figure 6A:
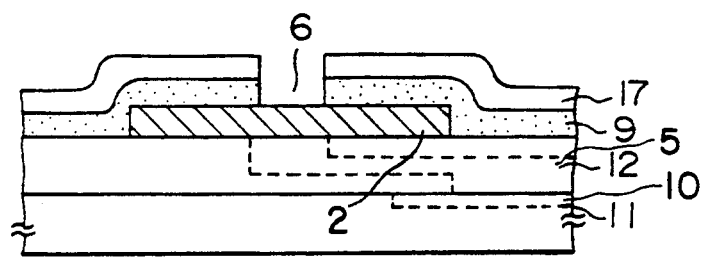
FIG. 6(a), (b) and (c) shows another manufacturing process of the first embodiment of the present invention.
Figure 6B:
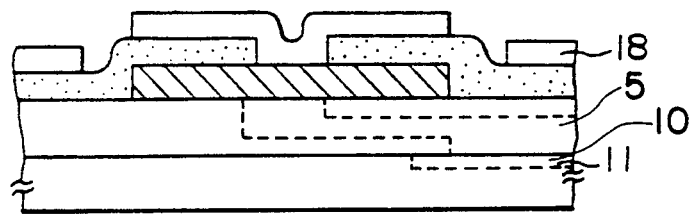
Figure 6C:
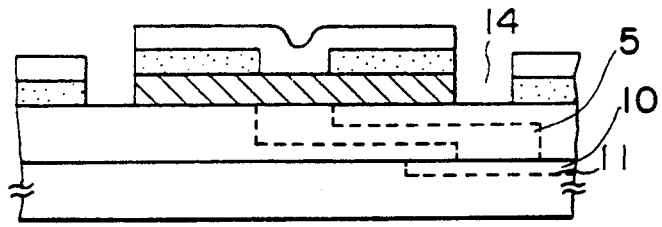
Figure 7:
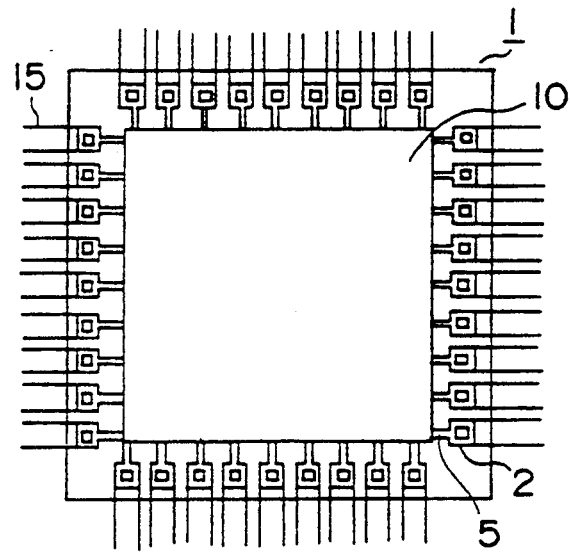
FIG. 7 is a plan view of a semiconductor device having a bump structure according to the present invention.

FIG. 1 is a cross sectional view of the semiconductor device having a bump structure, FIG. 2 is a perspective plan view thereof, omitting the inner leads, FIGS. 3 to 5 are manufacturing process diagrams of the semiconductor device, FIG. 6 is a manufacturing process diagram of the semiconductor device according to another method of the first embodiment of the present invention, and FIG. 7 is a plan view of a semiconductor device according to the present invention.

As shown in FIG. 7, the semiconductor device according to the present invention has a semiconductor element 10 which is formed on a semiconductor substrate and a plurality of electrode pads 2 arranged around the outer periphery of the semiconductor element, and the semiconductor element is connected to the electrode pads via signal wires.

On the silicon semiconductor substrate 11, an insulating film 12 of $SiO_2$, etc. is formed. The insulating film 12 is sometimes a field oxide film of $SiO_2$ as previously described. In this case, a wiring composed of signal lines connected to the electrode pads is formed as a first wiring layer on the semiconductor substrate. However, the wirings and the electrode pads which the wiring constitutes are not necessarily formed in the first wiring layer. For example, it is possible to form a second, third or more wiring layers using interlayer insulating films of $LPDSiO_2$, etc. precipitated from BPSG or supersaturated fluoric acid solution of silicon, and to use the uppermost layer as a wiring layer including signal lines connected to the electrode pads.

Furthermore, the electrode pads 2 are formed on the insulating film 12 using aluminium or aluminium alloy material and are connected to signal lines 5 of the same material (FIG. 2). Above the substrate 11, a protective layer 9 for protecting electrode pads 2 and signal lines 5 is provided. This protective layer is composed of PSG/SiN composite film with SiN film at the base, and has an opening 6 at a predetermined portion (approximately at the center in this embodiment) on the electrode pad 2. This opening is used to connect an external circuit connecting line to the electrode pad 2 therethrough, and preferably as small as possible in order to protect the electrode pads of aluminium and to maintain moisture-resistance characteristics. In this embodiment, this opening is an opening to ensure bump connection. A bump 7 is connected to the electrode pad 2 through this opening 6. The bump is usually composed of gold. Consequently, if the aluminium or aluminium alloy touches this gold, the aluminium will diffuse by electromigration phenomenon, etc. resulting in a break in the wiring. In order to hinder this diffusion, a barrier metal layer 8 is provided between both metal layers. The barrier metal is composed of a plurality of metal layers, such as Pd/Ni/Ti composite metal film, for example. To the bump 7, an inner lead 15 is connected by ILB. In the protective layer 9, an exposing opening 14 is provided so as to enclose the electrode pad 2 except for a part of the signal line 5 so that the periphery of the electrode pad 2 can be exposed through this exposing opening 14.

As a method to bond the inner lead to the electrode pad, in general, after alignment of both parts, heating and pressing are performed using the ILB tool. When the bump is pressed by the ILB tool, the applied force is transmitted to the upper part of the electrode pad 2. Since the sides of the electrode pad are exposed as previously described, the electrode pad 2 deforms externally from the sides. Furthermore, the force is externally released from the sides and therefore less force is applied to the insulating film 12 provided in the lower part. As a result, the number of cracks occurring in the insulating film can be remarkably decreased.

The barrier metal layer is not necessarily provided. For example, if silicide film of $MoSi_2$ or $Ti_2$ is provided on the metal pad 2, the barrier metal layer is not necessary because the silicide will not diffuse into the gold of the bump. As the protective film 9, not only PSG/SiN composite film, but also a SiN/PSG composite film or a one layer PSG film can be used. Furthermore, it is possible to use a composite film including a $LPDSiO_2$ film precipitated from a supersaturated fluoric acid solution of silicon.

Figure 3A:
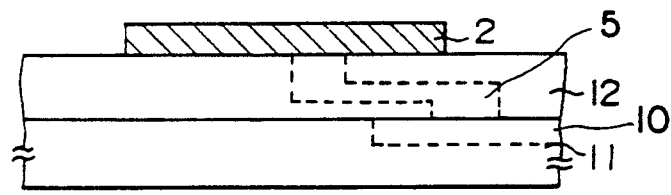
FIG. 3(a) and (b) shows the manufacturing process of the first embodiment of the present invention.
Figure 3B:
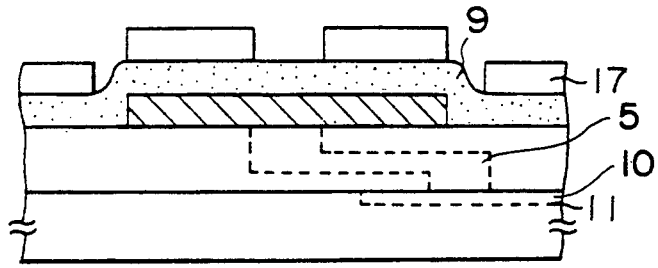

Next, the process of making the semiconductor device according to the first embodiment will be described hereinbelow with reference to FIGS. 3 to 5. First, a plurality of electrode pads 2 of aluminium or aluminium alloy which are connected to the semiconductor element in the substrate 11 are formed by patterning (FIG. 3(a)). Subsequently, the protective film 9 of a PSG/SiN composite film, etc. is formed by sequentially depositing a SiN film and a PSG film using a CVD technique or the like. This protective film also covers the electrode pad 2. The opening 6 for bump connection and exposing opening 14 are made by PEP (Photo Engravement Process). More specifically, the protective film 9 is covered by a resist film 17 and then the resist film 17 is removed so as to have openings at the central part and peripheral part of the electrode pad 2 (FIG. 3(b)). Then, the exposed protective film 9 is etched away using an ordinary etching technique so as to simultaneously form the above-mentioned opening 6 for bump connection and the exposing opening 14 (FIG. 4(a)). The sides of the electrode pads 2 are exposed by forming the exposing openings. Thereafter, after removing the resist film 17, a barrier metal 8 is deposited on the protective film 9 including the electrode pad 2 and its peripheral part. The barrier metal is composed of a lamination of Ti film which is directly in contact with the electrode pad 2 as a first layer, Ni film as a second layer and Pd film which is in contact with the gold bump as a third layer (FIG. 4(b)). Then a resist film 18 is deposited over the semiconductor substrate 11 to cover the barrier metal 8. An opening is formed at the opening 6 for bump connection and around the opening 6. In this state, if electrical plating, for example, of gold is performed, the gold is deposited on the barrier metal 8 in the opening to form the gold bump 7 (FIG. 5(a)). Thereafter, by removing the resist film 18, the barrier metal 8 is exposed except for the bump 7 portion.

Then, the barrier metal 8 is selectively etched by wet etching, etc. using the bump 7 as an etching mask. Though it is not illustrated, the side of the electrode pad 2 is slightly etched by the etchant and recessed from the exposing opening 14 because the side the electrode pad of aluminium or its alloy is exposed. If this etching of the electrode pad is strictly avoided, an etchant which tends to not etch aluminium or the other material of electrode pad can be used. Furthermore, the barrier metal can be etched utilizing CDE (Chemical Dry Etching) process as one etching technique.

According to the above-mentioned method, since the opening 6 for bump connection and exposing opening 14 are formed at the same time using the same resist film, the manufacturing process can be facilitated. However, as shown in FIGS. 6(a), 6(b) and 6(c), the opening 6 for bump connection and exposing opening 14 are formed by separate process steps using different resist films 17 and 18.

Figure 14:
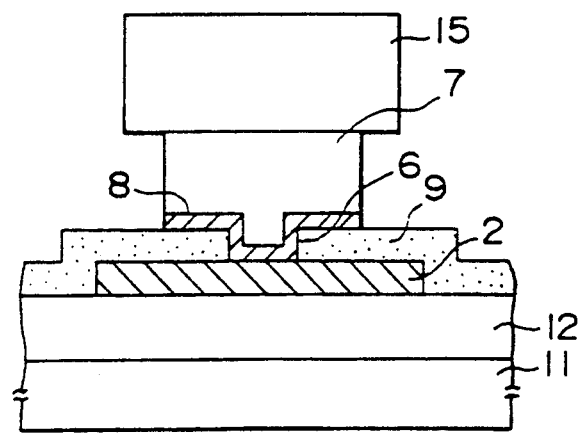
FIG. 14 is a cross sectional view of a conventional semiconductor device.
Figure 15:
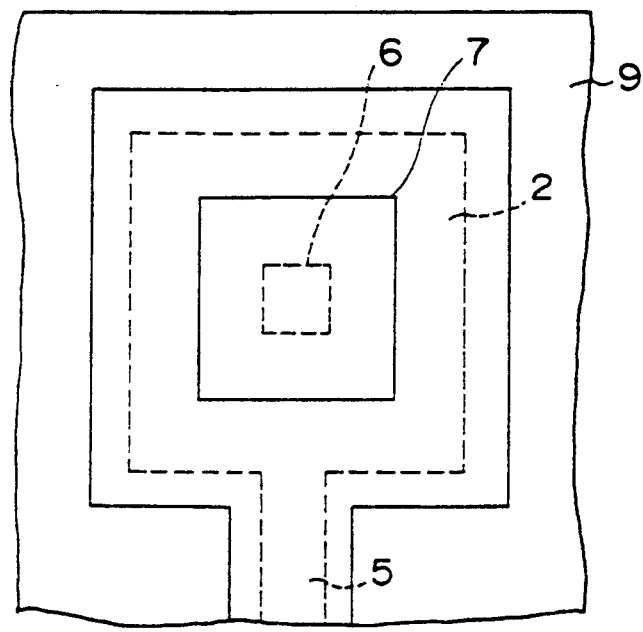
FIG. 15 is a perspective plan view of the semiconductor device of FIG. 14, omitting the inner leads.
Figure 16:
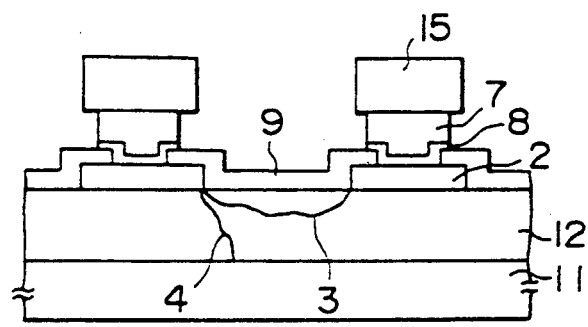
FIG. 16 is a cross sectional view of a conventional semiconductor device showing operations in bonding.
Figure 17:
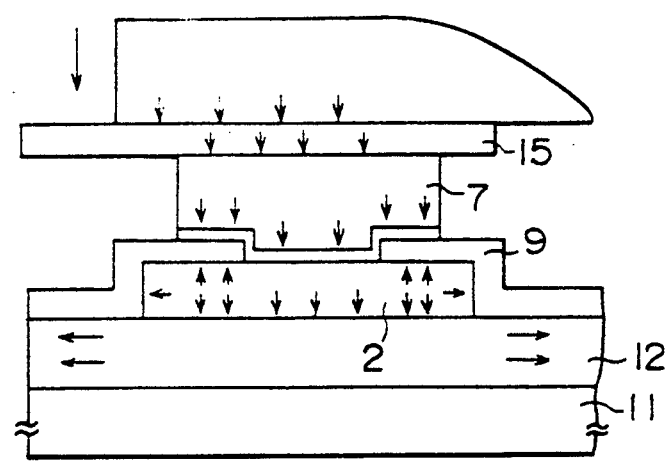
FIG. 17 is a cross sectional view of a conventional semiconductor device showing operations in bonding.

When an inner lead of a tape carrier is secured to this semiconductor device, the inner lead 15 is bonded to the electrode pad 2 of the semiconductor device using ILB. At this time, a force is applied to the bump 7 from the inner lead 15 by the ILB tool. This force is transmitted to an approximate center and the electrode pad 2 deforms so as to project downwardly by the application of the force at the center portion. However, the side of the electrode pad 12 can release the force applied thereto by freely deforming without being restricted by the protective film 9, etc. provided around the electrode pad since the side of the electrode pad is exposed externally. More specifically, as shown in FIG. 14, if the electrode pad 2 is restricted by the protective film 9, when the force is applied at the approximate center, the electrode pad 2 can not deform freely. Therefore, the force applied to the electrode pad 2 is directly transmitted to the insulating film 12, resulting in the occurrence of cracks in the insulating film 12.

Figure 8:
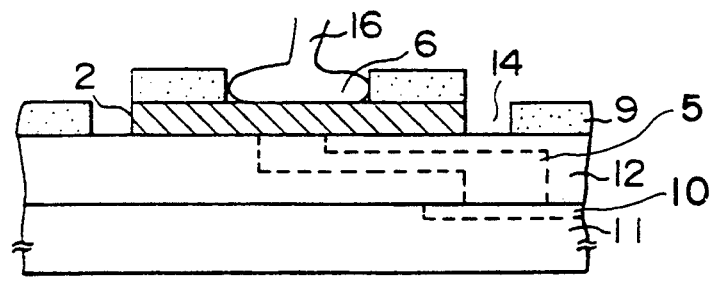
FIG. 8 is a cross sectional view of the second embodiment of the present invention.
Figure 9:
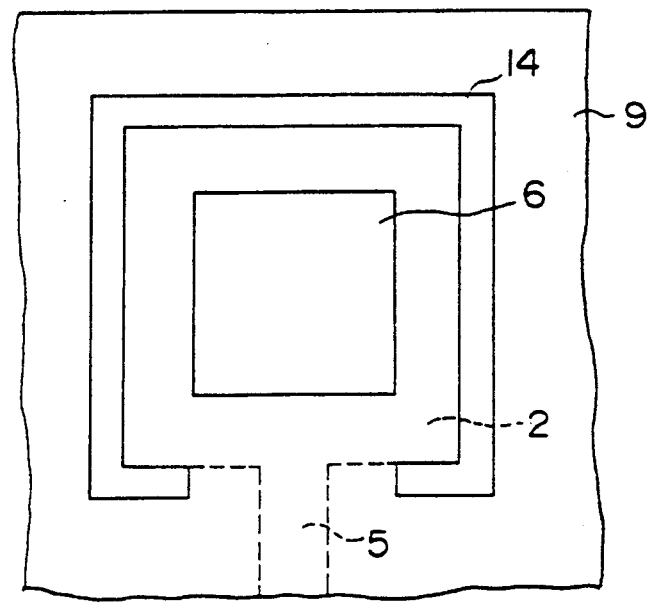
FIG. 9 is a perspective plan view of the structure of FIG. 8, omitting bonding wires.

Next, the second embodiment will be described with reference to FIGS. 8 and 9. FIG. 8 is a cross sectional view of the semiconductor device having bonding wires and FIG. 9 is a perspective plan view of the structure of FIG. 8 with bonding wires omitted. In the previous embodiment, inner leads and outer leads are used as external circuit connection means. In this embodiment, a lead frame and bonding wires connected thereto are employed as the external circuit connection means. In this wire bonding method, it is not necessary to form a bump because fine lines as wires made of gold or aluminium, etc. are directly connected to the electrode pads. On a silicon semiconductor substrate 11 on which semiconductor elements are fabricated, an insulating film 12 is deposited and then an electrode pad 2 which is electrically connected to the semiconductor element via the signal line 5 is provided and further, the insulating film 12 and the electrode pad 2 are covered by a protective film 9. In the protective film, an opening 6 for external circuit connection at an approximate center position and exposing opening 14 at peripheral position of the electrode pad 2, results in the exposure of the approximate center portion of the electrode pad and sides thereof. The construction described for up to this portion is the same as that of bump structure semiconductor device shown in FIGS. 1 and 2. Thereafter fine wires of aluminium, etc. as bonding wires 16 are connected to the approximate center portion of the exposed electrode pad 2 using capillaries, etc. If the electrode pad 2 is pressed from the upper direction by a force at the wire bonding, since the force is released to the side direction because of the deformation of the electrode, any force which might cause damage to the insulating film 12 is not transmitted to the insulating film 12.

Figure 10:
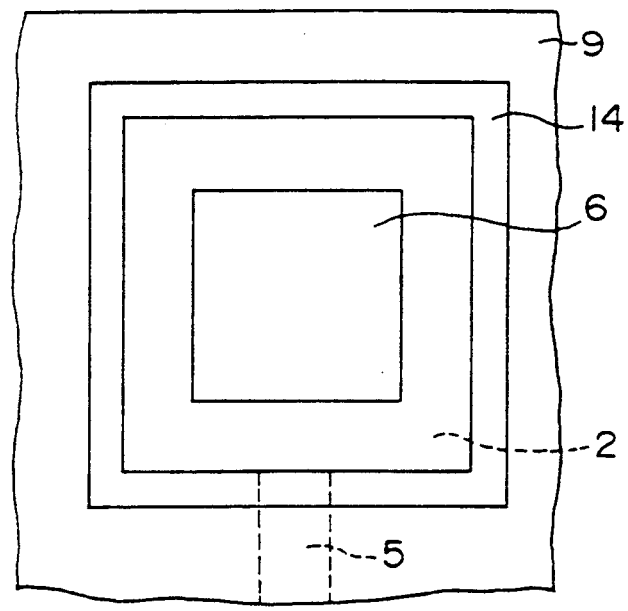
FIG. 10 is a perspective plan view of the third embodiment of the present invention.

Further, the third embodiment is described with reference to FIGS. 10 to 12.

In the previous embodiments, the exposing opening 14 for exposing the sides of the electrode pad 2 formed on the protective film 9 is made to enclose the peripheral portion of the electrode pad 2 except for the signal line 5 portion. In both embodiments, the exposing opening 14 is not provided in the vicinity of the signal line 5. This is because if an exposing opening is provided at the signal line portion, aluminium or its alloy of the signal line may be etched away when the unnecessary part of the barrier metal which is formed between the aluminium electrode pad and gold bump is etch removed by wet etching, etc. However, as shown in FIG. 10, if the exposing opening is provided for the entire periphery, the force applied during bonding is distributed uniformly and excessive force will not be applied to other portions. Therefore, such a structure is necessary to maintain good characteristics of semiconductor devices. In the case of employing an exposing opening of such a configuration, the existence of the barrier metal is undesirable and so it is preferable to employ the semiconductor device in which bonding wires are directly connected to the electrode pads as described in the second embodiment or the semiconductor device which uses etching resistant materials such as $MoSi_2$ or $TiSi_2$.

However, the protective film (passivation film) is originally formed to maintain the moisture resistant characteristics of the semiconductor and to maintain the operational characteristics, and therefore the exposure of aluminium and the like which are easily corroded, should be limited to a necessary minimum. For this purpose, as shown in FIG. 11, exposing openings each having an appropriate length at each side are provided to selectively expose instead of providing a continuous exposing opening along the sides. Of course, it is a necessary condition to maintain the force releasing function. However, if this point is kept in mind, the force applied during bonding can be distributed while maintaining the moisture resistance characteristics. In this case, if the bonding method and/or the material of the signal wire is properly selected, it is possible to provide the exposing opening at the side where the signal line exists.

FIG. 12 shows a configuration which limits the location of the exposing opening to the position where the cracks easily occur. With higher density and larger scale integration, the distance between neighboring electrode pads is becoming smaller and smaller. For example, at present, the pitch of two neighboring electrode pads is about 100 $\mu$m, but this pitch is gradually decreasing to 80 $\mu$m and further to 60 $\mu$m. In response to this decreasing in the pitch of the pads the distance between the electrodes is also decreasing to 14 $\mu$m and further to 6 $\mu$m. Therefore, if there is no exposing opening as in the conventional art, the effect at the insulating film between the electrode pads caused by the stress at the bonding becomes significant. Therefore, as shown in this figure, the exposing openings 14 formed in the protective film 9 are arranged along the sides where arranged electrode pads 2 are facing each other and the effect of stress is significant. In other words, the exposing openings 14 are formed along the two sides disposed in right and left. Furthermore, the lengths of the exposing openings 14 are made longer than those of the sides for exposing the sides of the electrode pad 2, so that the electrode pad 2 can sufficiently deform in the exposing opening direction.

Figure 13:
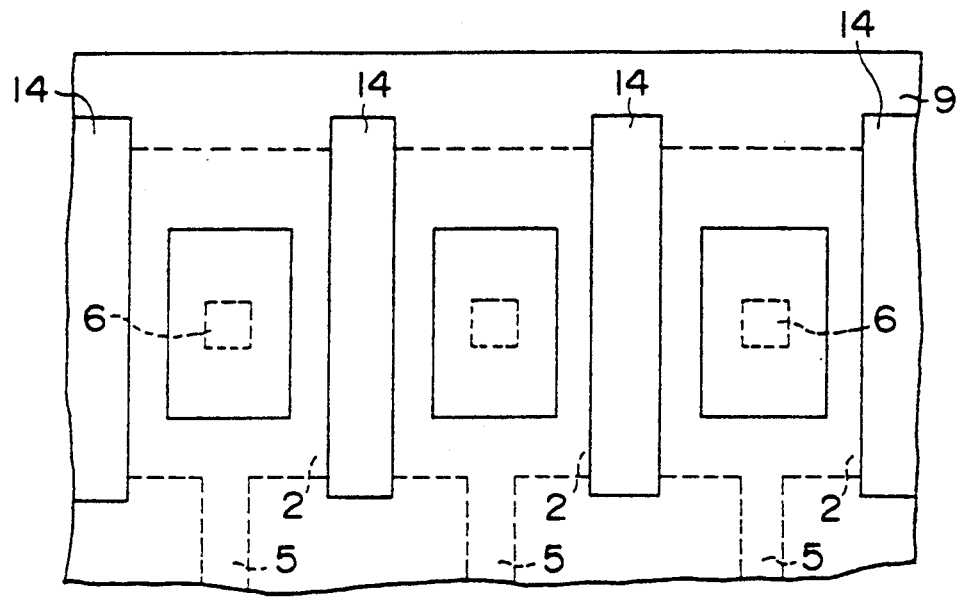
FIG. 13 is a perspective plan view of the fourth embodiment of the present invention.

Next, the fourth embodiment will be described with reference to FIG. 13.

If a pair of exposing openings at both sides of the electrode pad is provided as shown in FIG. 12, when a plurality of electrode pads are arranged, two parallel exposing openings will exist between two electrode pads. As previously described, the distance between electrode pads 2 is becoming smaller and smaller and it is productively very difficult to provide two exposing openings between two electrode pads. Therefore, in this embodiment, only one exposing opening is provided between the two electrode pads 2. Similar to the previous embodiment, the length of this exposing opening 14 is made longer than that of the side of the electrode pad 2 so as to project the exposing opening 14 from the upper and lower sides and to facilitate deformation of the electrode pad 2. If the sides of the electrode pad can be effectively exposed, one exposing opening and two exposing openings have the same effect and fewer are advantageous for fabrication. In the case shown in FIG. 13, not only decreasing the distance between pads but also the width of the electrode pad in the direction of arrangement (referred pad width hereinafter) is decreased so as to realize high density. However, the length of the electrode pad in the up and down direction will not affect high density because the electrode pads will not be arranged in the up and down direction. Therefore, the conventional length in the up and down directions is maintained as much as possible so that ILB or wire bonding can be easily performed. As a result, since the pad length in the up and down directions becomes 50 $\mu$m and the pad width in the direction of arrangement becomes 25 $\mu$m or less, the configuration of the electrode pad in this embodiment becomes almost rectangular.

As the semiconductor material of the semiconductor device to which the present invention is applied, any existing material such as Si, GaAs, etc. can be used.

As described before, according to the present invention, since sides of an electrode pad are externally exposed via exposing openings provided in a protective film, in the case where an inner lead of a tape carrier is bonded to the electrode pad via a bump using ILB or the case where a bonding wire is bonded to the electrode pad using a wire bonding method, the force applied to the electrode pad is released in the side direction by the deformation of the electrode pad. Therefore, the force from the electrode pad will not be concentrated to the insulating film as a base film and so the occurrence of cracks can be effectively suppressed.

We claim:

1. A semiconductor device, comprising:
a substrate on which a semiconductor element is formed;
an insulating film formed on said substrate;
an electrode pad formed on said insulating film, said electrode pad being electrically connected to said semiconductor element by a signal line;
an insulating protective film covering a part of said insulating film, said insulating protective film including an opening through which said electrode pad is connected to an external circuit and an exposing opening provided at a peripheral portion of said electrode pad through which a side of said electrode pad is exposed externally; and
external circuit connection means for connecting said electrode pad and said external circuit via said opening.

2. The semiconductor device according to claim 1, wherein said external circuit connection means is a bonding wire.

3. The semiconductor device according to claim 1, wherein said exposing opening is formed so as to enclose a peripheral portion of said electrode pad except for a portion where a signal line is provided.

4. The semiconductor device according to claim 1, wherein said exposing opening is formed so as to enclose the whole periphery of said electrode pad.

5. The semiconductor device according to claim 1, wherein said exposing opening is formed so as to enclose a peripheral portion of said electrode pad, said exposing opening being divided into a plurality of openings.

6. The semiconductor device according to claim 1, wherein a plurality of said electrode pads are arranged side by side on said substrate, and said exposing opening is provided at each side facing a neighboring electrode pad in the peripheral portion.

7. The semiconductor device according to claim 6, wherein a length of said exposing opening is longer than that of side of the electrode pad facing to the neighboring electrode pad and the exposing opening projecting from the facing sides of the electrode pads.

8. The semiconductor device according to claim 1, wherein a plurality of said electrode pads are arranged side by side on said substrate, and one said exposing opening is provided between said electrode pads which are arranged side by side.

9. The semiconductor device according to claim 8, wherein a length of said exposing opening is longer than that of a side of the electrode pad facing the neighboring electrode pad and the exposing opening projecting from the facing sides of the electrode pads.

10. A semiconductor device, comprising:
a substrate in which a semiconductor element is formed;
an insulating film formed on said substrate;
an electrode pad formed on said insulating film, said electrode pad being electrically connected to said semiconductor element by a signal line;
an insulating protective film covering a part of said insulating film, said insulating protective film including an opening through which said electrode pad is connected to an external circuit and an exposing opening provided at a peripheral portion of said electrode pad through which a side of said electrode pad is exposed externally;
a bump formed at said electrode pad via said opening for an electrode pad connection; and
an inner lead which is connected to said bump, for connecting said external circuit to said electrode pad via said opening for the electrode pad connection.

11. The semiconductor device according to claim 10, wherein said electrode pad is composed of aluminum and aluminum alloy and is connected to the bump and the inner lead via barrier metal.

12. The semiconductor device according to claim 10, wherein said exposing opening is formed so as to enclose a peripheral portion of said electrode pad except for a portion where a signal line is provided.

13. The semiconductor device according to claim 10, wherein said exposing opening is formed so as to enclose the whole periphery of said electrode pad.

14. The semiconductor device according to claim 10, wherein said exposing opening is formed so as to enclose a peripheral portion of said electrode pad, said exposing opening being divided into a plurality of openings.

15. The semiconductor device according to claim 10, wherein a plurality of said electrode pads are arranged side by side on said substrate, and said exposing opening is provided at each side facing a neighboring electrode pad in the peripheral portion.

16. The semiconductor device according to claim 15, wherein a length of said exposing opening is longer than that of a side of the electrode pad facing to the neighboring electrode pad and the exposing opening projecting from the facing sides of the electrode pads.

17. The semiconductor device according to claim 10, wherein a plurality of said electrode pads are arranged side by side on said substrate, and one said exposing opening is provided between said electrode pads which are arranged side by side.

18. The semiconductor device according to claim 17, wherein length of said exposing opening is longer than that of a side of the electrode pad facing the neighboring electrode pad and the exposing opening projecting from the facing sides of the electrode pads.

19. A method of manufacturing a semiconductor device, comprising the steps of:
   forming an insulating film on a semiconductor substrate in which a semiconductor element is formed;
   forming an electrode pad on said insulating film conductive layer, said electrode pad being electrically connected to said semiconductor element by a signal line;
   forming an insulating protective film for covering a part of said insulating film;
   forming an opening through which said electrode pad is connected to an external circuit;
   forming an exposing opening at a peripheral portion of said electrode pad through which a side of said electrode pad is exposed externally; and
   connecting the electrode pad and the external circuit via said opening.

20. The method according to claim 19, wherein said step of forming said exposing opening and said connecting step are performed at the same time.

* * * * *